United States Patent
Shiraishi

(10) Patent No.: US 11,913,993 B2
(45) Date of Patent: Feb. 27, 2024

(54) DETECTOR AND DETECTION METHOD

(71) Applicant: GS Yuasa International Ltd., Kyoto (JP)

(72) Inventor: Takeyuki Shiraishi, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 470 days.

(21) Appl. No.: 17/277,580

(22) PCT Filed: Sep. 25, 2019

(86) PCT No.: PCT/JP2019/037455
§ 371 (c)(1),
(2) Date: Mar. 18, 2021

(87) PCT Pub. No.: WO2020/067088
PCT Pub. Date: Apr. 2, 2020

(65) Prior Publication Data
US 2022/0034970 A1 Feb. 3, 2022

(30) Foreign Application Priority Data
Sep. 26, 2018 (JP) .................................. 2018-179903

(51) Int. Cl.
*B60W 20/50* (2016.01)
*G01R 31/367* (2019.01)
(Continued)

(52) U.S. Cl.
CPC ............ *G01R 31/367* (2019.01); *B60L 58/12* (2019.02); *B60W 20/50* (2013.01); *G01R 31/3828* (2019.01); *H01M 10/48* (2013.01)

(58) Field of Classification Search
CPC ...................................................... H01M 10/48
(Continued)

(56) References Cited

U.S. PATENT DOCUMENTS

2009/0102433 A1   4/2009  Kamaga
2009/0200993 A1*  8/2009  Maeda ...................... H02J 7/14
                                                    322/99
(Continued)

FOREIGN PATENT DOCUMENTS

JP   H09-261801 A    10/1997
JP   2006-117131 A   11/2006
(Continued)

OTHER PUBLICATIONS

International Searching Authority, International Search Report and Written Opinion for International Application No. PCT/JP2019/037455, dated Nov. 19, 2019, (10 pages), Japan Patent Office, Tokyo, Japan.

*Primary Examiner* — Edward Tso
*Assistant Examiner* — Ahmed H Omar
(74) *Attorney, Agent, or Firm* — Alston & Bird LLP

(57) ABSTRACT

A detector 100, which detects an abnormality of a communication line L1 connecting a moving body controller 30 and an energy storage apparatus 50 that are mounted on a moving body 10, detects occurrence or non-occurrence of the abnormality of the communication line L1 based on at least two pieces of information from: a moving body state signal Sv transmitted from the moving body controller 30 to the energy storage apparatus 50 and stored in the energy storage apparatus 50; a communication state between the moving body controller 30 and the energy storage apparatus 50; and information on the charge and discharge of the energy storage apparatus 50.

6 Claims, 12 Drawing Sheets

| | Vehicle state signal | Current state of vehicle | Communication state | Information on charge and discharge | | Abnormality determination for communication line |
|---|---|---|---|---|---|---|
| | | | | Charge | Discharge | |
| Detection method 1 | 1 (traveling) | Traveling | No communication | -- | -- | Abnormal |
| Detection method 2 | 0 (parking) | Cranking | No communication | No | Yes (detection of cranking) | Abnormal |
| Detection method 3 | 0 (parking) | Traveling | No communication | Yes | Yes | Abnormal |
| Detection method 4 | 0 (parking) | Traveling | No communication | Yes | No | Abnormal |

(51) Int. Cl.
    *G01R 31/3828*     (2019.01)
    *B60L 58/12*     (2019.01)
    *H01M 10/48*     (2006.01)

(58) Field of Classification Search
    USPC .......................................................... 320/132
    See application file for complete search history.

(56) References Cited

U.S. PATENT DOCUMENTS

| | | | |
|---|---|---|---|
| 2013/0181514 A1 | 7/2013 | Ikeda et al. | |
| 2016/0336626 A1* | 11/2016 | Kawauchi | H02J 7/0032 |
| 2017/0117595 A1* | 4/2017 | Hase | H01M 10/482 |
| 2017/0282820 A1* | 10/2017 | Kondo | B60L 3/04 |
| 2018/0259585 A1 | 9/2018 | Shiraishi | |

FOREIGN PATENT DOCUMENTS

| | | |
|---|---|---|
| JP | 2007-286786 A | 11/2007 |
| JP | 2009-106053 A | 5/2009 |
| JP | 2014-087153 A | 5/2014 |
| JP | 2015-216012 A | 12/2015 |
| JP | 2017-005985 A | 1/2017 |
| JP | 2018-146416 A | 9/2018 |
| WO | WO-2012/043590 A1 | 4/2012 |

* cited by examiner

Fig. 7

| | Vehicle state signal | Current state of vehicle | Communication state | Information on charge and discharge | | Abnormality determination for communication line |
|---|---|---|---|---|---|---|
| | | | | Charge | Discharge | |
| Detection method 1 | 1 (traveling) | Traveling | No communication | – | – | Abnormal |
| Detection method 2 | 0 (parking) | Cranking | No communication | No | Yes (detection of cranking) | Abnormal |
| Detection method 3 | 0 (parking) | Traveling | No communication | Yes | Yes | Abnormal |
| Detection method 4 | 0 (parking) | Traveling | No communication | Yes | No | Abnormal |

DETECTOR AND DETECTION METHOD

CROSS REFERENCE TO RELATED APPLICATIONS

This application is a national stage application, filed under 35 U.S.C. § 371, of International Application No. PCT/JP2019/037455, filed Sep. 25, 2019, which international application claims priority to and the benefit of Japanese Application No. 2018-179903, filed Sep. 26, 2018; the contents of both which as are hereby incorporated by reference in their entireties.

BACKGROUND

Technical Field

The present invention relates to a method for detecting an abnormality of a communication line.

Description of Related Art

A battery mounted on a moving body is connected to an electronic control unit (ECU) mounted on the moving body by a communication line, and information on the state of the moving body, such as the operation state of the engine, is obtained from the ECU. In JP-A-2009-106053, if, while the engine is stopped, the capacity of a battery may fall below a state of charge (SOC) at which the moving body can be started, a relay provided inside the battery is cut off.

BRIEF SUMMARY

When there is an abnormality such as disconnection in the communication line, the energy storage apparatus cannot obtain the information on the state of the moving body from the ECU. Therefore, detecting an abnormality in the communication line has been an issue to be solved.

The present invention has been made based on the above circumstances, and it is an object of the present invention to detect an abnormality of a communication line connecting an energy storage apparatus and a moving body controller.

A detector, which detects an abnormality of a communication line connecting a moving body controller and an energy storage apparatus that are mounted on a moving body, detects occurrence or non-occurrence of the abnormality of the communication line based on at least two pieces of information from: a moving body state signal transmitted from the moving body controller to the energy storage apparatus and stored in the energy storage apparatus; a communication state between the moving body controller and the energy storage apparatus; and information on the charge and discharge of the energy storage apparatus.

The present technique can be applied to a detection method for detecting the abnormality of the communication line, an abnormality detection program for detecting the abnormality of the communication line, and a storage medium storing the abnormality detection program.

It is possible to detect an abnormality of a communication line connecting a moving body controller and an energy storage apparatus.

BRIEF DESCRIPTION OF THE FIGURES

FIG. 7 is a chart summarizing a moving body state signal, an actual state of the moving body, a communication state, information on charge and discharge, and an abnormality determination result for each detection method.

DETAILED DESCRIPTION OF VARIOUS EMBODIMENTS

Figure 1:
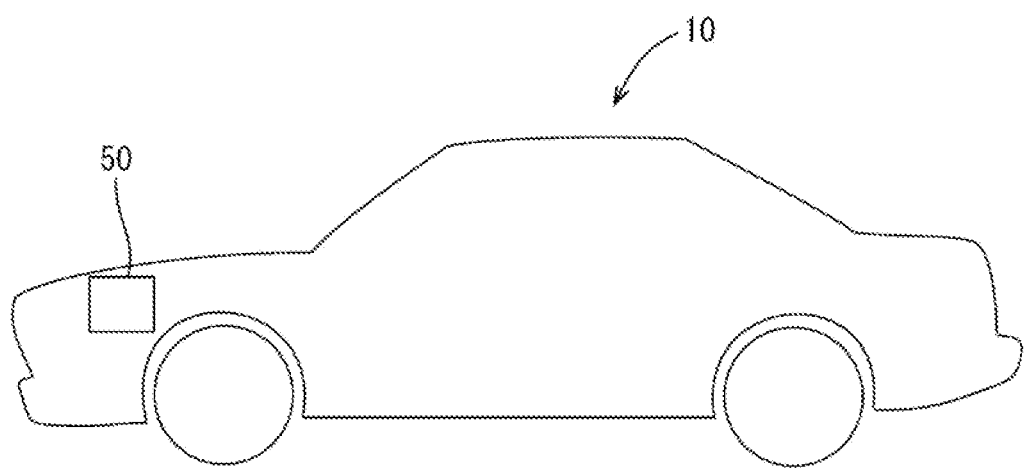
FIG. 1 is a side view of a moving body in a first embodiment.

A detector, which detects an abnormality of a communication line connecting a moving body controller and an energy storage apparatus that are mounted on a moving body, detects occurrence or non-occurrence of the abnormality of the communication line based on at least two pieces of information from: a moving body state signal transmitted from the moving body controller to the energy storage apparatus; a communication state between the moving body controller and the energy storage apparatus; and information on the charge and discharge of the energy storage apparatus. The charge and discharge include states in which only the charge is performed, only the discharge is performed, and the charge and discharge are performed.

The moving body state signal, the communication state between the moving body controller and the energy storage apparatus, and the information on the charge and discharge of the energy storage apparatus is information that can be collected using the normal function of the energy storage apparatus. Therefore, with this method, the abnormality of the communication line can be detected using the normal function of the energy storage apparatus.

The detector may determine that the communication line is abnormal when the moving body state signal is a signal indicating that the moving body is traveling and there is no communication between the energy storage apparatus and the moving body controller. With this method, it is possible to detect the abnormality of the communication line which occurs during traveling, such as disconnection due to vibration during traveling.

The detector may determine that the communication line is abnormal based on information on the charge and discharge of the energy storage apparatus accompanying a start of an engine mounted on the moving body and based on the presence or absence of communication between the moving body controller and the energy storage apparatus accompanying the start of the engine.

With this method, it is possible to detect the abnormality of the communication line that occurs while the engine is stopped, such as failure to reconnect the communication line during maintenance.

The detector may determine that the communication line is abnormal when there is no communication between the energy storage apparatus and the moving body controller during a period in which the energy storage apparatus repeats the charge and discharge.

During the traveling of the moving body, the energy storage apparatus may repeat discharge to the electric load and regenerative charge. With this method, it is possible to detect the abnormality of the communication line which occurs during traveling in which the charge and discharge are repeated.

The detector may prohibit control for interrupting the current of the energy storage apparatus when determining that the communication line is abnormal.

When there is an abnormality in the communication line, the energy storage apparatus cannot accurately detect the state of the moving body from the content of the communication or the presence or absence of the communication. When the state of the moving body cannot be accurately detected, the control for opening the current breaker is prohibited, so that the power source of the moving body can be prevented from being cut off in a state where the state of the moving body is uncertain.

First Embodiment

1. Description of Moving Body 10 and Battery 50

Figure 2:
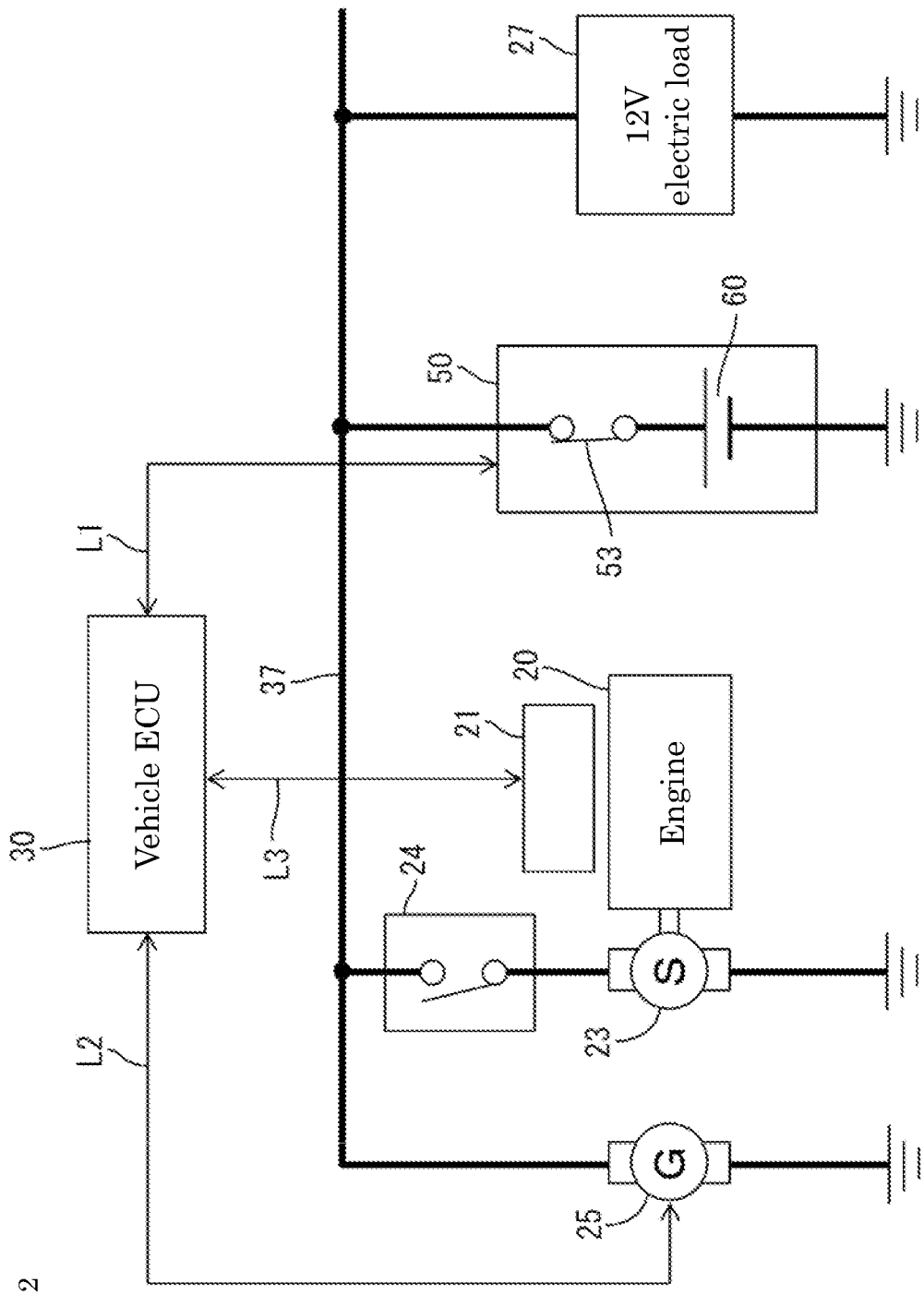
FIG. 2 is a block diagram showing an electrical configuration of a moving body.

FIG. 1 is a side view of a moving body (automobile) 10, and FIG. 2 is a block diagram showing the electrical configuration of the moving body 10. The moving body 10 is an engine-driven vehicle.

As shown in FIG. 2, the moving body 10 includes an engine 20 that is a drive apparatus, an engine controller 21, an engine starter 23, an alternator 25 that is a moving body electric generator, a general electric load 27, a moving body electronic control unit (ECU) 30, a battery 50, and the like. The moving body ECU 30 is an example of the moving body controller, and the battery 50 is an example of the energy storage apparatus.

Battery 50 is connected to a power line 37. The engine starter 23, the alternator 25, and the general electric load 27 is connected to the battery 50 via the power line 37.

The engine starter 23 is a cell motor. When an ignition switch 24 is turned on, a cranking current flows from the battery 50 to drive the engine starter 23. By driving the engine starter 23, a crankshaft rotates to start the engine 20.

The general electric load 27 is an electric load mounted on the moving body 10, excluding the engine starter 23. The general electric load 27 is rated at 12 V and can be exemplified by an air conditioner, audio equipment, a car navigation system, accessories, and the like.

The alternator 25 is a moving body electric generator that generates power by the power of the engine 20. When the amount of power generated by the alternator 25 exceeds the amount of electric load of the moving body 10, the alternator 25 charges the battery 50. When the amount of power generated by the alternator 25 is smaller than the amount of electric load of the moving body 10, the battery 50 discharges to compensate for the shortage of the amount of power generated.

The moving body ECU 30 is connected to the battery 50 so as to be able to communicate therewith via a communication line L1 and is connected to the alternator 25 so as to be able to communicate therewith via a communication line L2. The moving body ECU 30 receives information about SOC from the battery 50 and controls the amount of power generated by the alternator 25, thereby controlling the SOC of the battery 50. The SOC is the state of charge.

$$SOC = Cr/Co \times 100 \quad (1)$$

Co is a full charge capacity of a secondary battery, and Cr is a residual capacity of the secondary battery.

The moving body ECU 30 is connected to the engine controller 21 so as to be able to communicate therewith via a communication line L3. The engine controller 21 is mounted on the moving body 10 and monitors the operation state of the engine 20. The engine controller 21 monitors the traveling state of the moving body 10 from measured values of instruments such as a speed measuring instrument. The moving body ECU 30 can obtain, from the engine controller 21, information about turning on and off of the ignition switch 24, information about the operation state of the engine 20, and information about the traveling state (traveling, stopping traveling, stopping idling, etc.) of the moving body 10.

Figure 3:
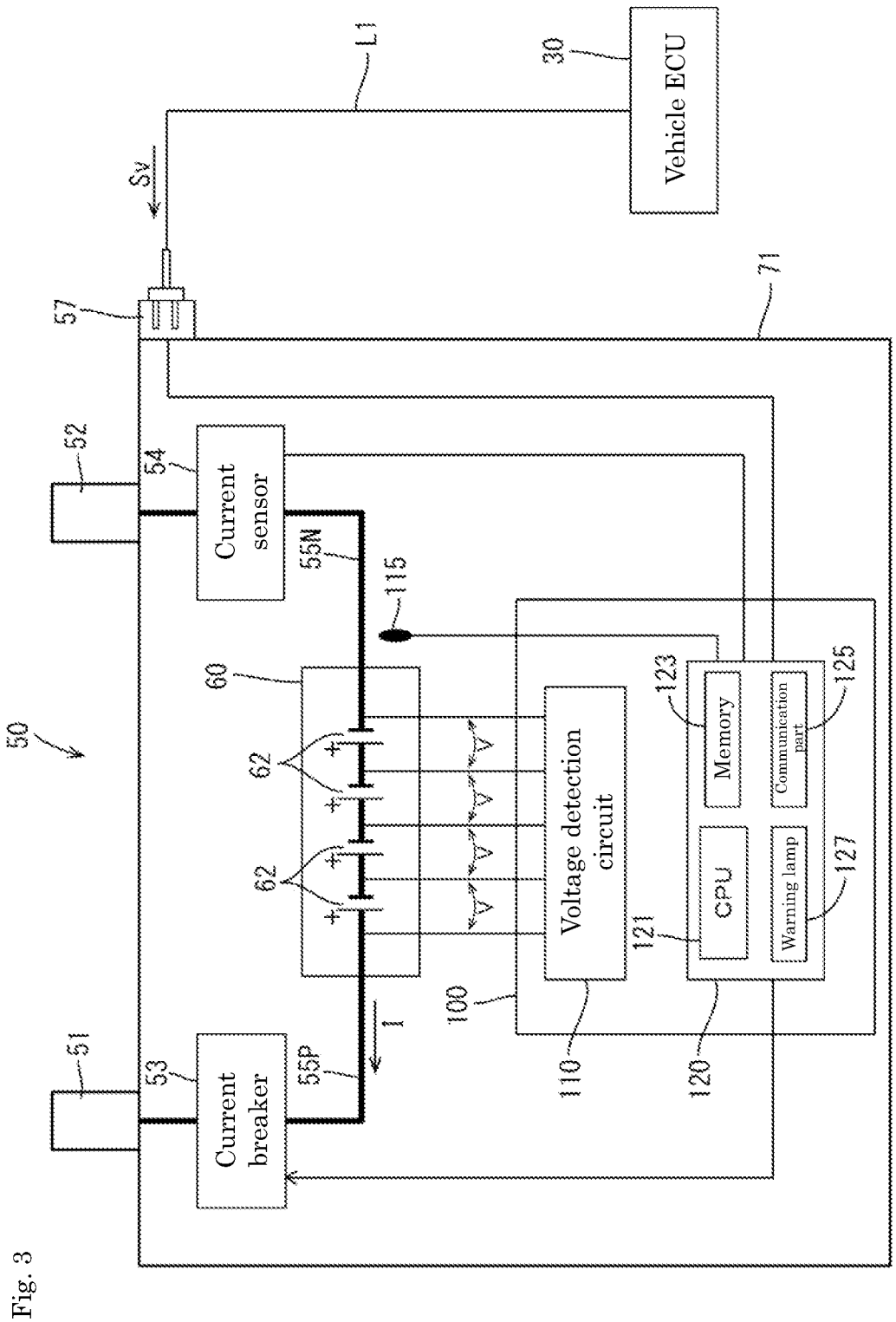
FIG. 3 is a block diagram showing an electrical configuration of a battery.

FIG. 3 is a block diagram showing the electrical configuration of the battery 50. The battery 50 includes a current breaker 53, an assembled battery 60 made up of a plurality of secondary batteries 62, a current sensor 54, a management apparatus 100, a temperature sensor 115, and a connector 57. The management apparatus 100 is an example of the detector for detecting the abnormality of the communication line L1. The secondary battery 62 is an example of an energy storage device.

The current breaker 53, the assembled battery 60, and the current sensor 54 are connected in series via power lines 55P, 55N. The power line 55P is a power line for connecting the external terminal 51 of the positive electrode and the positive electrode of the assembled battery 60. The power line 55N is a power line for connecting the external terminal 52 of the negative electrode to the negative electrode of the assembled battery 60. The current breaker 53 is located on the positive electrode side of the assembled battery 60 and is provided on the power line 55P on the positive electrode side. The current sensor 54 is located on the negative electrode side of the assembled battery 60 and is provided on the power line 55N of the negative electrode.

The current breaker 53 can be made of a contact switch (mechanical type) such as a relay, or a semiconductor switch such as a field-effect transistor (FET) or a transistor. By opening the current breaker 53, the current of the battery 50 can be interrupted. By closing the current breaker 53, the battery 50 comes into the state of being able to supply power to the moving body 10.

The current sensor 54 measures a current I [A] of the assembled battery 60. The discharge and charge of the battery 50 can be discriminated from the polarity (positive and negative) of the measured value of the current sensor 54. The temperature sensor 115 measures the temperature [° C.] of the assembled battery 60 in a contact or non-contact manner.

The management apparatus 100 is provided in the circuit board unit 65. The management apparatus 100 includes a voltage detection circuit 110 and a processing part 120. The voltage detection circuit 110 is connected to both ends of each secondary battery 62 by signal lines and measures a battery voltage V [V] of each secondary battery 62 and to total voltage VB of the assembled battery 60. The total voltage VB [V] of the assembled battery 60 is the total voltage of four secondary batteries 62 connected in series.

The processing part 120 includes a CPU 121 having an arithmetic function, a memory 123 which is a storage part, and a communication part 125. The processing part 120 monitors the current I of the assembled battery 60, the voltage V of each secondary battery 62, and the total voltage VB and the temperature of the assembled battery 60 from the outputs of the current sensor 54, the voltage detection circuit 110, and the temperature sensor 115.

The memory 123 is a non-volatile storage medium such as flash memory or an electrically erasable programmable read-only memory (EEPROM). The memory 123 can store various kinds of information such as the moving body state signal Sv. The memory 123 is an example of the storage part.

The memory 123 stores a monitoring program for monitoring the state of the assembled battery 60 and data necessary for executing the monitoring program. The memory 123 stores an abnormality detection program for executing abnormality detection processing to detect the abnormality of the communication line L1 and stores data necessary for executing the abnormality detection program. The abnormality detection program can be written into a recording medium such as a compact disc read-only memory (CD-ROM). The connector 57 is provided to connect the communication line L1.

Figure 4:
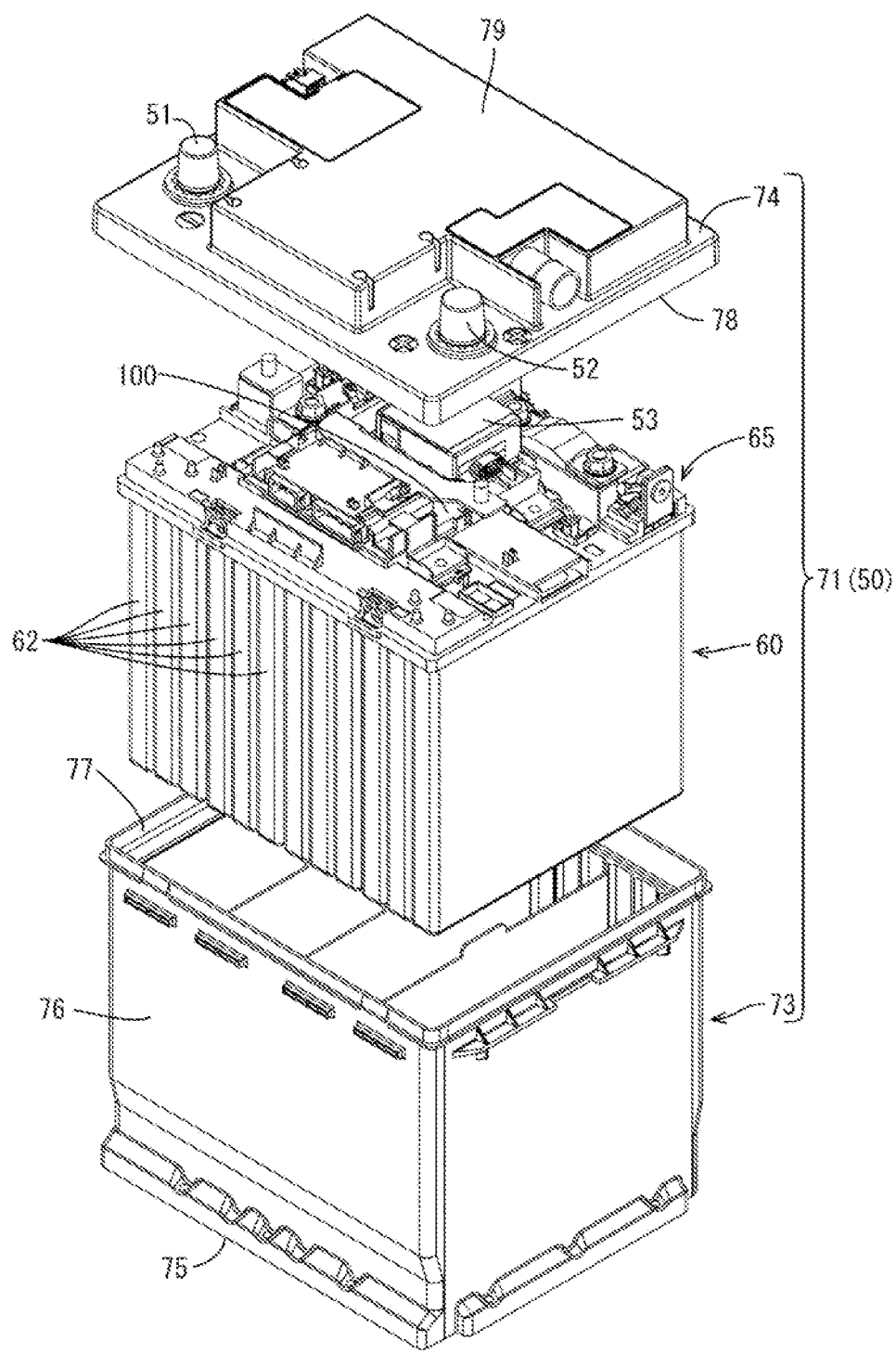
FIG. 4 is an exploded perspective view of the battery.

As shown in FIG. 4, the battery 50 includes a housing 71. The housing 71 includes a body 73 made of a synthetic resin material and a lid body 74. The body 73 has a bottomed cylindrical shape. The body 73 includes a bottom surface portion 75 and four side surface portions 76. An upper opening 77 is formed in an upper-end portion by the four side surface portions 76.

The housing 71 houses the assembled battery 60 and a circuit board unit 65. The assembled battery 60 has twelve secondary batteries 62. The twelve secondary batteries 62 are connected with three in parallel and four in series. The circuit board unit 65 is disposed in the upper portion of the assembled battery 60. In the block diagram of FIG. 3, three secondary batteries 62 connected in parallel are represented by one battery symbol.

The lid body 74 closes the upper opening 77 of the body 73. An outer peripheral wall 78 is provided around the lid body 74. The lid body 74 has a protrusion 79 in a substantially T-shape in plan view. The external terminal 51 of the positive electrode is fixed to one corner of the front portion of the lid body 74, and the external terminal 52 of the negative electrode is fixed to the other corner portion.

Figure 5A:
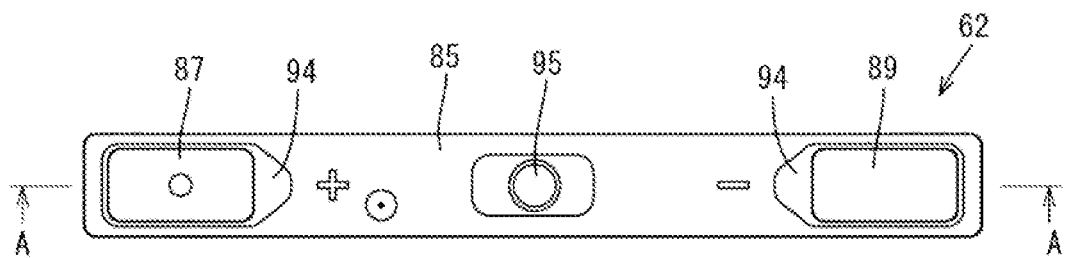
FIG. 5A is a plan view of a secondary battery.
Figure 5B:
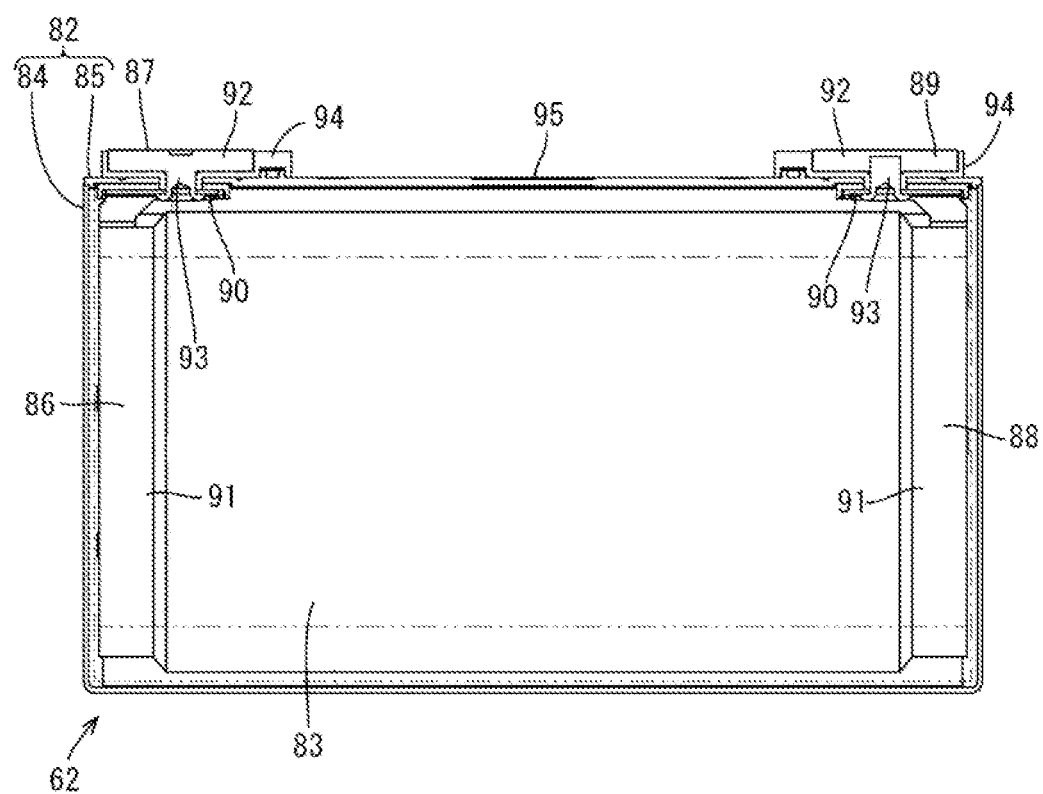
FIG. 5B is a cross-sectional view taken along line A-A of FIG. 5A.

As shown in FIGS. 5A and 5B, the secondary battery 62 houses an electrode assembly 83 in a rectangular parallelepiped case 82 together with a nonaqueous electrolyte. The secondary battery 62 is, for example, a lithium ion secondary battery. The case 82 has a case body 84 and a lid 85 for closing an opening at the top of the case body 84.

Although not shown in detail, the electrode assembly 83 has a separator, made of a porous resin film, disposed between a negative electrode element formed by applying an active material to a substrate made of copper foil and a positive electrode element formed by applying an active material to a substrate made of aluminum foil. These are all belt-shaped, and are wound in a flat shape so as to be able to be housed in the case body 84 in a state where the negative electrode element and the positive electrode element are displaced from each other on the opposite sides in the width direction with respect to the separator.

The positive electrode element is connected to a positive electrode terminal 87 via a positive electrode current collector 86, and the negative electrode element is connected to a negative electrode terminal 89 via a negative electrode current collector 88. Each of the positive electrode current collector 86 and the negative electrode current collector 88 is made up of a plate-shaped base 90 and legs 91 extending from the base 90. A through hole is formed in the base 90. The leg 91 is connected to the positive electrode element or the negative electrode element. Each of the positive electrode terminal 87 and the negative electrode terminal 89 is made up of a terminal body portion 92 and a shaft 93 protruding downward from the center portion of the lower surface of the terminal body portion 92. The terminal body portion 92 and the shaft 93 of the positive electrode terminal 87 are integrally formed of aluminum (single material). In the negative electrode terminal 89, the terminal body portion 92 is made of aluminum, the shaft 93 is made of copper, and these are assembled. The terminal body portions 92 of the positive electrode terminal 87 and the negative electrode terminal 89 are arranged at both ends of the lid 85 via gaskets 94 made of an insulating material and are exposed to the outside from the gaskets 94.

The lid 85 has a pressure release valve 95. As shown in FIG. 5A, the pressure release valve 95 is located between the positive electrode terminal 87 and the negative electrode terminal 89. The pressure release valve 95 is opened when the internal pressure of the case 82 exceeds a limit value to lower the internal pressure of the case 82.

2. Communication and Moving Body State Signal Sv

When the moving body ECU 30 detects some sort of travel preparation operation for the moving body 10 parked, such as the turning on and off the ignition switch 24 or the opening and closing of the door, the moving body ECU 30 starts communication with the battery 50 via the communication line L1. Through the communication between the moving body ECU 30 and the battery 50, the moving body ECU 30 receives information on the state of the battery 50 such as SOC from the battery 50. The battery 50 receives the moving body state signal Sv from the moving body ECU 30.

The moving body state signal Sv is a signal indicating the state of the moving body 10 such as parking, traveling, cranking, stopping the moving body, and stopping idling. "Parking" means that at least the engine 20 is stopped and the moving body 10 is unmoved for a predetermined time or longer. "Idling stop" is to temporarily stop the engine 20 when the moving body stops, such as waiting for a signal.

The moving body state signal Sv representing "parking" is 0, the moving body state signal Sv representing "traveling" is 1, the moving body state signal Sv representing "cranking" is 2, the moving body state signal Sv representing "stopping the moving body" is 3, and the moving body state signal Sv representing "stopping idling" is 4.

When receiving the moving body state signal Sv from the moving body ECU 30, the battery 50 stores the data into the memory 123. The communication between the two is frequently made in a communication cycle Tc except for a parking period, so that the moving body state signal Sv stored in the memory 123 is updated to a signal indicating the latest state of the moving body 10. When there is an abnormality in the communication, the moving body state signal Sv is not updated, and hence the moving body state becomes uncertain. The communication cycle Tc is, for example, 100 [msec].

When detecting the parking of the moving body 10, the moving body ECU 30 transmits the moving body state signal Sv of "0" indicating the parking to the battery 50 and then interrupts the communication with the battery 50 via the communication line L1, and the interrupted state of the communication is maintained in the parking period. Also, when the communication has been interrupted, the battery 50 determines that the moving body 10 is parked.

3. Abnormality Detection Processing for Communication Line L1 (Detection Method 1 of FIG. 7)

Figure 6:
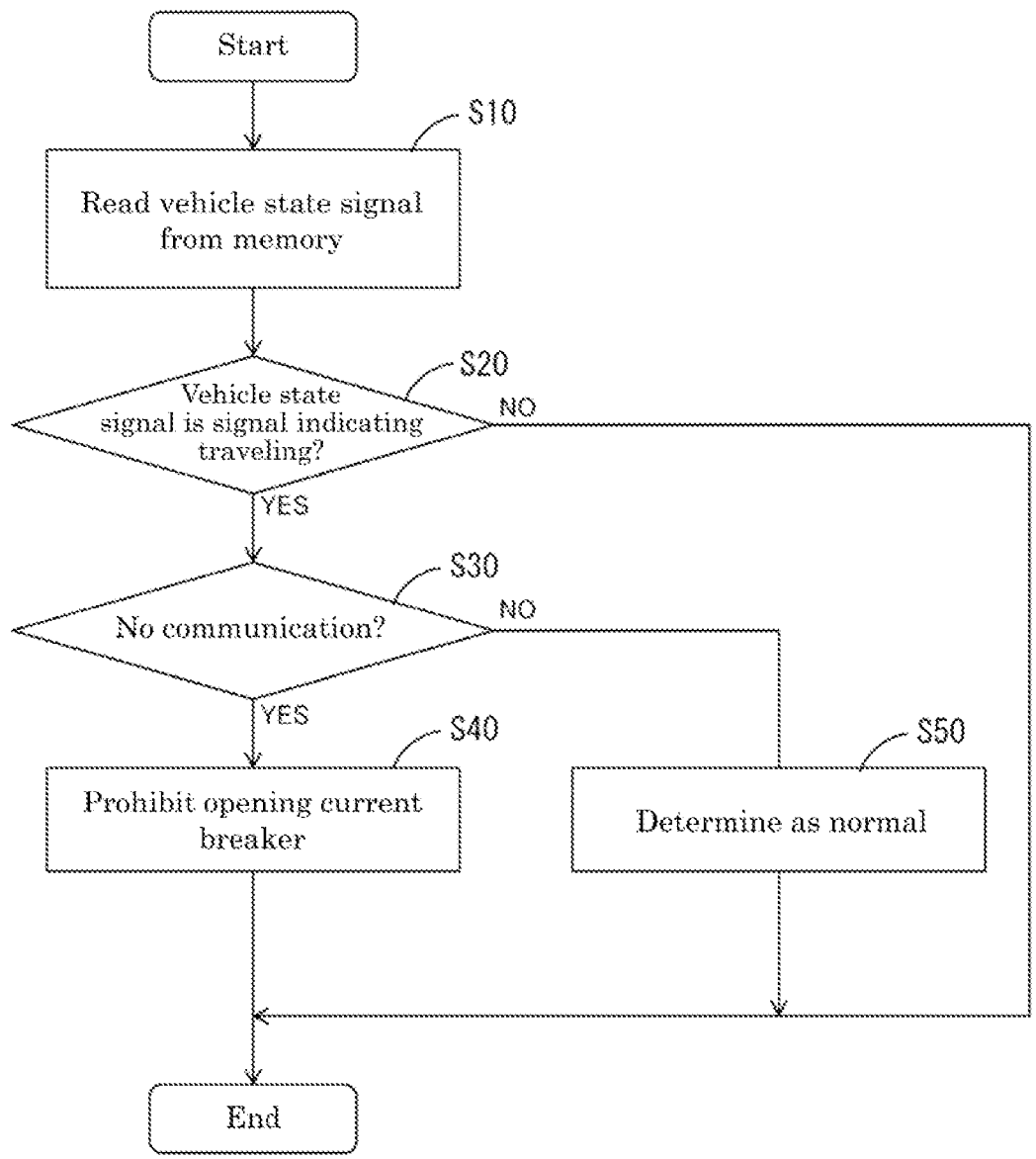
FIG. 6 is a flowchart of abnormality detection processing.

FIG. 6 is a flowchart of abnormality detection processing for communication line L1. The abnormality detection processing for the communication line L1 is executed at a predetermined cycle by the management apparatus 100 regardless of the state of the moving body. The abnormality detection processing is made up of five steps of S10 to S50.

The management apparatus 100 first accesses the memory 123 and reads the moving body state signal Sv (S10).

The management apparatus 100 determines whether or not the read moving body state signal Sv is a signal indicating the traveling (S20).

When the moving body state signal Sv is not "1" indicating the traveling (S20: NO), the occurrence or non-occurrence of the abnormality of the communication line L1 is not determined based on a detection method 1 shown in FIG. 7, and the process ends.

When the moving body state signal Sv is "1" indicating the traveling (S20: YES), the management apparatus 100 confirms the presence or absence of the communication with the moving body ECU 30. The management apparatus 100 determines that there is no communication when information such as the moving body state signal Sv has not been transmitted from the moving body ECU 30 and the communication has not been made with the moving body ECU 30 for a period longer than the communication cycle Tc.

When there is no communication (S30: YES), the management apparatus 100 determines that the communication line L1 is abnormal. The reason why such a determination can be made is that there is a high possibility of abnormality in the communication line L1 when there is no communication for a period longer than the communication cycle Tc although the moving body state signal Sv is "1" indicating the traveling.

When detecting the abnormality of the communication line L1, the management apparatus 100 prohibits opening the current breaker 53 (S40). When there is an abnormality in the communication line L1, the moving body state signal Sv is not updated, and the fact that communication has been cut off may be erroneously determined as parking, so that the battery 50 cannot accurately recognize the state of the moving body. When the state of the moving body cannot be accurately recognized, the control for opening the current breaker 53 is prohibited, whereby the power source of the moving body 10 can be prevented from being cut off in a state where the state of the moving body is uncertain.

When there is communication (S30: NO), the management apparatus 100 determines that the communication line L1 is normal (S50).

FIG. 7 is a chart summarizing the moving body state signal Sv, the actual state of the moving body, the communication state, information on charge and discharge, and the abnormality determination result for each detection method. The communication state includes the presence or absence, frequency, and cycle of the communication between the moving body ECU 30 and the battery 50. The information on charge and discharge includes information on detection of cranking current, the performance or non-performance of charge and discharge, and repetition of charge and discharge.

In a first embodiment, the abnormality of the communication line L1 is detected using two pieces of information, which are the moving body state signal Sv and the communication state (Detection method 1 of FIG. 7).

4. Effect

The information on the moving body state signal Sv and the communication state is information that can be collected using the normal function of the battery 50. With this method, the abnormality of the communication line L1 can be detected using the normal function of the battery 50. The detection of the abnormality of the communication line L1 has the following effects.

In order to ensure the startability of the engine 20, when the SOC falls below a predetermined value during parking, the battery 50 may open the current breaker 53 to interrupt the current (current interruption process).

When an abnormality has occurred in the communication line L1, the moving body state signal Sv is not updated, and the fact that communication has been cut off may be erroneously determined as parking, so that the battery 50 cannot accurately recognize the state of the moving body. When the abnormality of the communication line L1 is detected, the control for opening the current breaker 53 is prohibited, so that the power source of the moving body can be prevented from being cut off in a state where the state of the moving body is uncertain.

Second Embodiment

In the first embodiment, the abnormality of the communication line L1 has been detected by the detection method 1 using two pieces of information, which are the moving body state signal Sv and the communication state. In a second embodiment, the abnormality of the communication line L1 is detected by a detection method 2 using two pieces of information, which are the information on the charge and discharge of the battery 50 and the communication state. The information on the charge and discharge includes information on detection of cranking current, the performance or non-performance of charge and discharge, and the repetition of the charge and discharge. The communication state includes the presence or absence, frequency, and cycle of the communication between the moving body ECU 30 and the battery 50.

Figure 8:
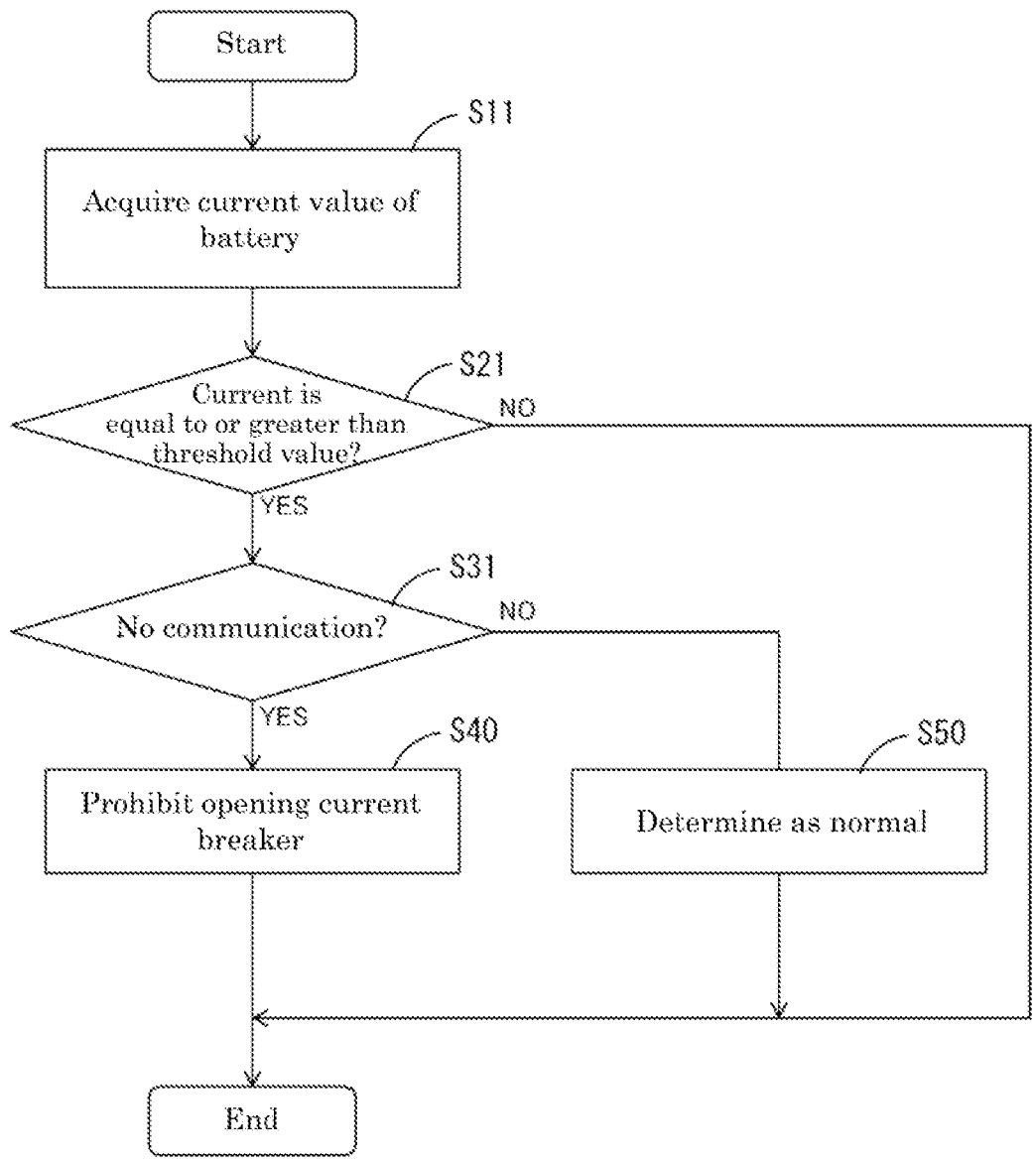
FIG. 8 is a flowchart of abnormality detection processing for a second embodiment.
Figure 9:
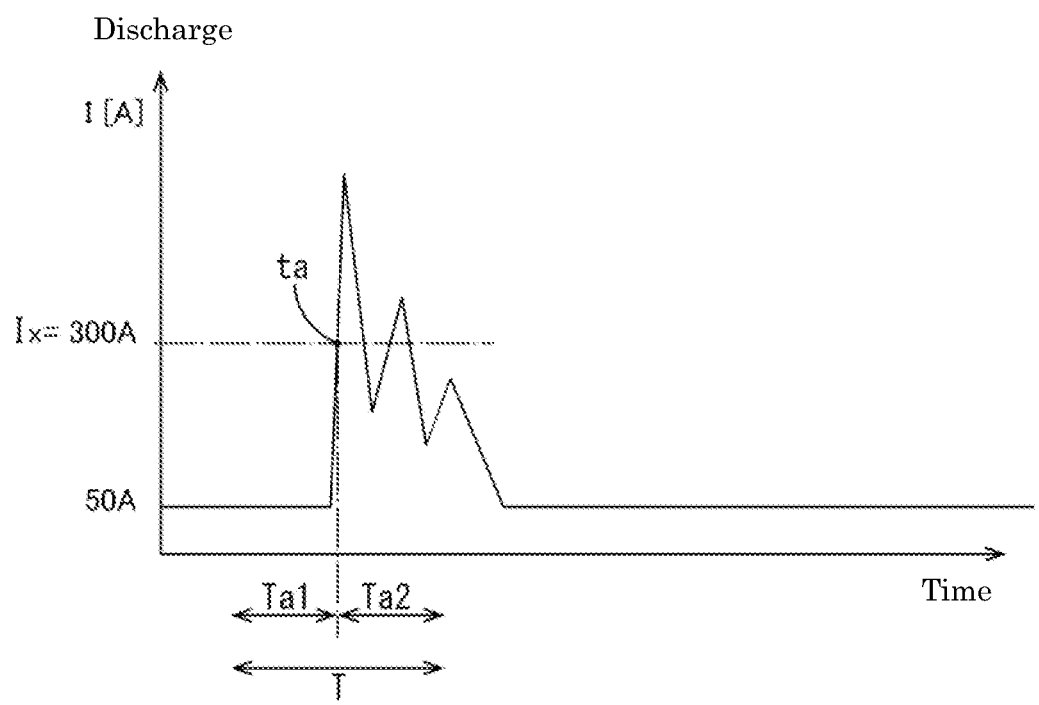
FIG. 9 is a current waveform of the battery during the engine start.

FIG. 8 is a flowchart of the abnormality detection processing for the communication line L1, and FIG. 9 is a current waveform of the battery during the engine start. The abnormality detection processing for the communication line L1 is executed at a predetermined cycle by the management apparatus 100 regardless of the state of the moving body. The abnormality detection processing is made up of five steps of S11 to S50.

The management apparatus 100 acquires a current I of the battery 50 measured by the current sensor 54 (S11).

When the current I of the battery 50 is discharge, the management apparatus 100 compares the discharge current I with a threshold value Ix (S21). The threshold value Ix is determined in accordance with a cranking current during the engine start. Cranking is to rotate a crankshaft (not shown) of the engine 20 in order to start the engine.

During cranking, the battery 50 releases a large discharge current of about 500 A or more. The threshold value Ix is a current value at a boundary between normal use and cranking and is, for example, 300 A.

When the discharge current I of the battery 50 is smaller than the threshold value Ix (S21: NO), the occurrence or non-occurrence of the abnormality of the communication line L1 is not determined, and the process ends.

When the discharge current I of the battery 50 is equal to or greater than the threshold value Ix (S21: YES), the management apparatus 100 confirms whether or not the communication has been made with the moving body ECU 30 within a predetermined period T before and after the time (cranking detection time) when the discharge current I exceeds the threshold value Ix (S31).

In the graph of FIG. 9, at time ta, the discharge current I exceeds the threshold value Ix, and the management apparatus 100 detects cranking. The management apparatus 100 confirms whether or not the communication has been made with the moving body ECU 30 in predetermined periods Ta1, Ta2 before and after the cranking detection time ta. Each of the predetermined periods Ta1, Ta2 is desirably sufficiently longer than the communication cycle Tc of the battery 50 and is, for example, 1 [sec].

When no communication is made in both the predetermined periods Ta1, Ta2 before and after (S31: YES), the management apparatus 100 determines that the communication line L1 is abnormal. The reason why such a determination can be made is that there is a high possibility of abnormality in the communication line L1 when there is no communication with the moving body ECU 30 during the engine start.

When detecting the abnormality of the communication line L1, the management apparatus 100 prohibits opening the current breaker 53 (S40).

When there is communication in at least one of the predetermined periods Ta1, Ta2 before and after (S31: NO), the management apparatus 100 determines that the communication line L1 is normal (S50). In the predetermined periods Ta1, Ta2 before and after, the communication content transmitted from the moving body ECU 30 to the battery 50 is considered to be the moving body state signal Sv of "2" indicating that the moving body 10 is cranking.

With this method, it is possible to detect the abnormality of the communication line L1 that occurs during parking, such as forgetting to connect the communication line L1 during maintenance.

In the second embodiment, the abnormality of the communication line L1 is detected using two pieces of information, which are the detection of the cranking current accompanying the start of the engine and the presence or absence of communication between the moving body ECU 30 and the battery 50 accompanying the start of the engine 20 in a predetermined period T (Detection method 2 of FIG. 7). The abnormality detection of the communication line L1 performed by the detection method 2 in the second embodiment can be performed when the moving body state signal Sv is "0" indicating that the vehicle is parked (NO in S20 of FIG. 6).

Third Embodiment

Figure 10:
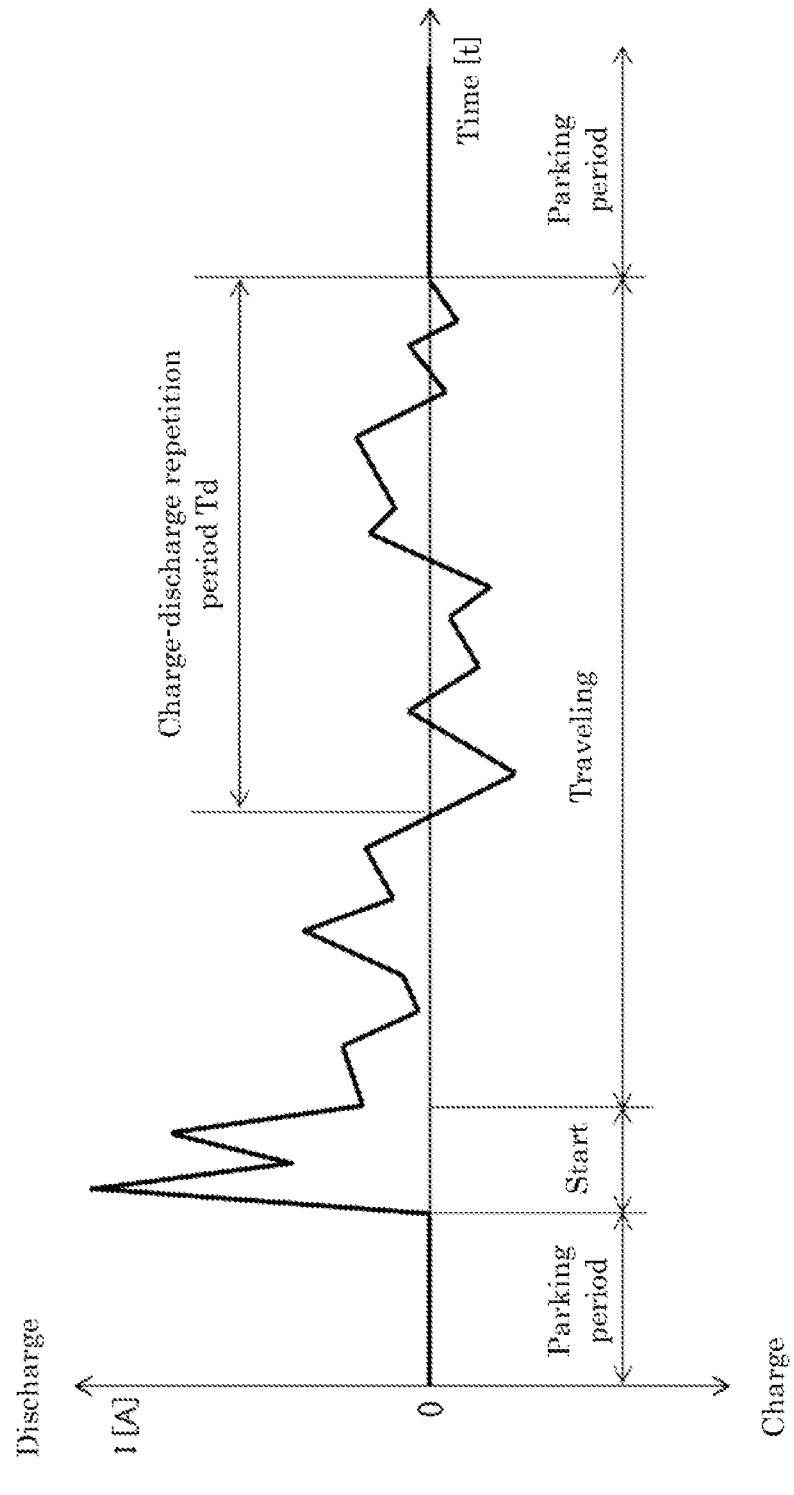
FIG. 10 is a current waveform of the battery during traveling for a third embodiment.

The battery 50 discharges when the amount of power generated by the alternator 25 is smaller than the load amount of the general electric load 27 during traveling. The battery 50 performs regenerative charge when the moving body 10 is decelerated. Thus, as shown in FIG. 10, a period Td in which the charge and discharge of the battery 50 are repeated may occur during the traveling of the moving body 10.

Figure 11:
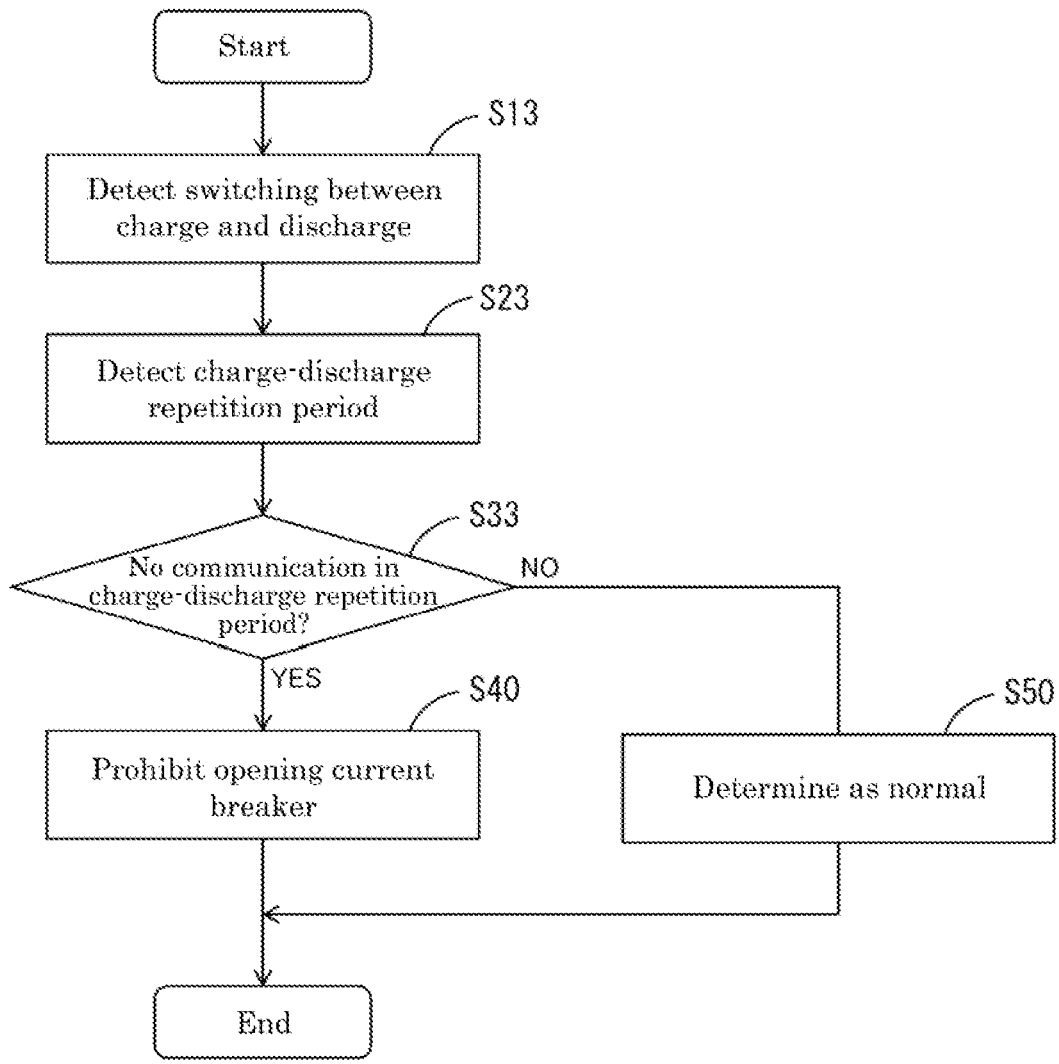
FIG. 11 is a flowchart of abnormality detection processing.

FIG. 11 is a flowchart of the abnormality detection processing for the communication line L1. The abnormality detection processing is executed after the engine start and is made up of five steps of S13 to S50.

After the engine is started, the management apparatus 100 detects, from the measured value of the current sensor 41, the switching between the charge and discharge of the battery 50 (S13).

When detecting the switching between the charge and discharge, the management apparatus 100 detects the charge-discharge repetition period Td from the frequency, interval, and the like of the switching (S23). The charge-discharge repetition period Td is, for example, a period in which the number of times of switching between the charge and discharge is equal to or smaller than a predetermined number of times within a predetermined time.

Next, the management apparatus 100 confirms the presence or absence of communication with the moving body ECU 30 for the charge-discharge repetition period Td. When no communication has been received for a period longer than the communication cycle Tc within the charge-discharge repetition period Td, the management apparatus 100 determines that there is no communication.

When there is no communication during the charge-discharge repetition period Td (S33: YES), the management apparatus 100 determines that the communication line L1 is abnormal. The reason why such a determination can be made is that there is a high possibility of abnormality in the communication line L1 when there is no communication although the charge and discharge are repeated while the moving body 10 is traveling.

When it is determined that there is an abnormality in the communication line L1, the management apparatus 100 prohibits opening the current breaker 53 (S40).

When there is communication during the charge-discharge repetition period Td (S33: NO), the management apparatus 100 determines that the communication line L1 is normal (S50).

In a third embodiment, the abnormality of the communication line L1 is detected using two pieces of information, which are the information on the charge and discharge of the battery 50 and the communication state (Detection method 3 of FIG. 7).

OTHER EMBODIMENTS

The present invention is not restricted to the embodiments described above and the drawings, but, for example, the following embodiments are included in the technical scope of the present invention.

(1) In the above first to third embodiments, the secondary battery 62 has been shown as an example of the energy storage device. The energy storage device is not restricted to the secondary battery 62 but may be a capacitor or the like. The connection of the secondary battery 62 is not limited to the connection in series and parallel but may be the connection only in series or only in parallel. The secondary battery 62 is not limited to a plurality of cells but may be a single cell (one secondary battery 62).

(2) In the first to third embodiments, the battery 50 has been used for starting the engine. The battery 50 may be used not only for starting the engine but also for auxiliary equipment, for assisting a driving motor, for receiving regeneration accompanying deceleration, and for backup to ensure the redundancy of the power source.

(3) In the first to third embodiments, the abnormality of the communication line L1 has been detected by the management apparatus 100 of the battery 50. A detector for detecting the abnormality of the communication line L1 may be provided separately from the battery 50. When the detector is provided separately from the battery 50, data (at least two pieces of information from: the moving body state signal; the communication state; and the information on charge and discharge) required for abnormality detection may be obtained from the battery 50 by communication.

(4) In the above second embodiment, the management apparatus 100 has detected the abnormality of the communication line L1 based on whether or not the communication with the moving body ECU 30 has been made in the predetermined periods Ta1, Ta2 before and after the cranking detection time ta. The communication with the moving body ECU 30 accompanying the engine start is generally started before cranking, but due to a delay in the start time of the moving body ECU 30, the communication with the moving body ECU 30 accompanying engine start may be made after cranking. Therefore, only the predetermined period Ta2 after cranking may be used as an inspection target period in which the presence or absence of communication is detected.

(5) The battery 50 is charged by an alternator 25 during the traveling of the moving body. Thus, the charge can be detected from the measured value of the current sensor 54, and in the charge period of the battery 50, the abnormality of the communication line L1 can be detected based on whether or not communication is made with the moving body ECU 30 (Detection method 4 of FIG. 7).

(6) In the third embodiment, the abnormality of the communication line L1 has been detected based on whether or not the battery 50 has been communicated with the moving body ECU 30 in the period Td in which charge and discharge are repeated. The abnormality of the communication line L1 can also be determined from two pieces of information, which are the moving body state signal Sv and the information on charge and discharge. For example, when the battery 50 is repeatedly charged and discharged despite the fact that the moving body state signal Sv recorded in the memory 123 of the battery 50 is "0" indicating parking, the communication line L1 can be determined to be abnormal. This is because, when the battery 50 performs "charge and discharge, or repetition thereof, which is the characteristic of the traveling" while the moving body state signal Sv indicates "parking", the communication line L1 can be determined to be abnormal because there is a conflict between the two states.

(7) In the first embodiment, based on two pieces of information which are the moving body state signal Sv stored in the memory 123 of the battery 50 and the communication state between the battery 50 and the moving body ECU 30, the occurrence or non-occurrence of the abnormality of the communication line L1 has been determined. The abnormality determination for the communication line L1 can be made based on at least any two pieces of information from the moving body state signal Sv; the communication state; and the information on the charge and discharge of the battery, and can also be made using all the three pieces of information.

Figure 12:
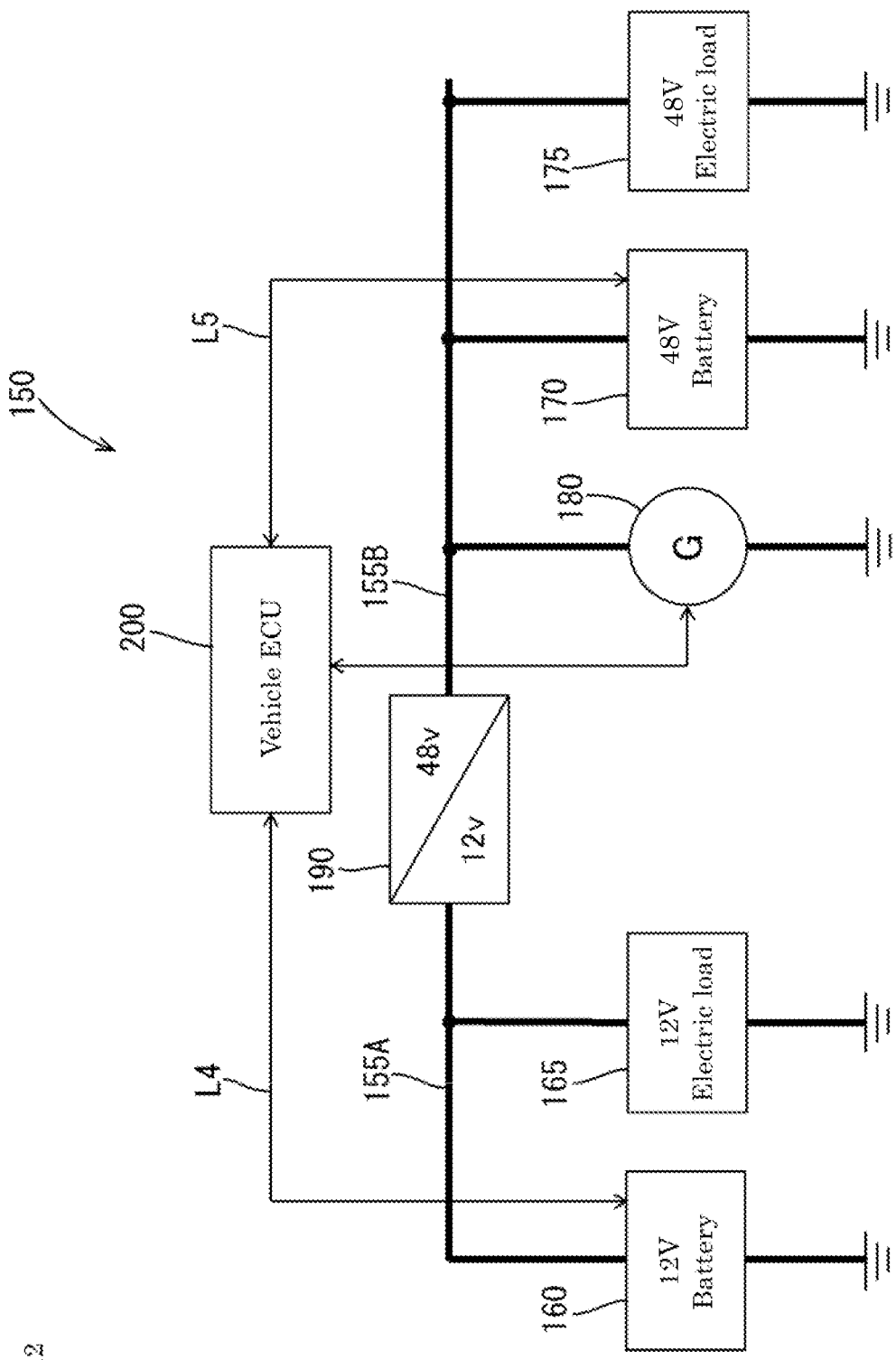
FIG. 12 is a block diagram of a 48V power supply system.

(8) In the first to third embodiments, the battery 50 has been rated at 12 V. The battery may be rated at 48 V. FIG. 12 is a block diagram of a 48V power supply system. A power supply system 150 is a system mounted on a mild hybrid vehicle or the like using an alternator 180 as an auxiliary motor of an engine. The power supply system 150 includes a 12V battery 160, a 48V battery 170, an alternator 180, a DC-to-DC converter 190, and a moving body ECU 200.

The DC-to-DC converter 190 connects two power lines 155A, 155B having different voltages. The power line 155A is for a rated voltage of 12 V and is connected with the 12V battery 160 and a 12 V electrical load 165. The power line 155B is for a rated voltage of 48 V and is connected to the alternator 180, the 48V battery 170, and a 48 V electrical load 175. The 12V battery 160 and the 48V battery 170 are connected to the moving body ECU 200 through communication lines L4, L5, respectively, and transmit and receive the moving body state signal Sv and battery information to and from the moving body ECU 200. The present technique can be applied to the 12V battery 160 to detect the abnormality of the communication line L4 connecting the 12V battery and the moving body ECU 200. Further, the present technique can be applied to the 48V battery 170 to detect the abnormality of the communication line L5 connecting the 48V battery and the moving body ECU 200.

(9) The present technique can be applied to an abnormality detection program for a communication line. An abnormality detection program for detecting an abnormality of a communication line connecting a moving body controller and an energy storage apparatus mounted on a moving body is a program for causing a computer to execute detection processing for detecting the occurrence or non-occurrence of the abnormality of the communication line based on at least two pieces of information from: a moving body state signal Sv transmitted from the moving body controller to the energy storage apparatus and stored in the energy storage apparatus; a communication state between the moving body controller and the energy storage apparatus; and information on the charge and discharge of the energy storage apparatus. The computer is, for example, a management apparatus 100. The present technique can be applied to a recording medium in which an abnormality detection program for a communication line is recorded.

(10) The moving body is not limited to a vehicle but may be an airplane.

The invention claimed is:

1. A detector for detecting an abnormality of a communication line connecting an energy storage apparatus and a moving body controller that are mounted on a moving body, wherein the detector is configured to:
   detect occurrence or non-occurrence of an abnormality of the communication line based on at least two pieces of information from:
      a moving body state signal transmitted from the body controller to the energy storage apparatus,
      a communication state between the moving body controller and the energy storage apparatus, and
      information on charge and discharge of the energy storage apparatus; and
   in response to detecting occurrence of the abnormality of the communication line, prohibit control for interrupting a current of the energy storage apparatus.

2. The detector according to claim 1, wherein the communication line is determined to be abnormal when the moving body state signal is a signal indicating that the moving body is traveling and there is no communication between the energy storage apparatus and the moving body controller.

3. The detector according to claim 1, wherein:
   the communication line is determined to be abnormal based on:

information on the charge and discharge of the energy storage apparatus accompanying a start of an engine mounted on the moving body, and presence or absence of communication between the moving body controller and the energy storage apparatus accompanying the start of the engine.

4. The detector according to claim 1, wherein the communication line is determined to be abnormal when there is no communication between the energy storage apparatus and the moving body controller during a period in which the energy storage apparatus repeats the charge and discharge.

5. An energy storage apparatus comprising:
an assembled battery;
a current breaker;
the detector according to claim 1; and
a housing that contains the assembled battery, the current breaker, and the detector,
wherein the current breaker is provided on a power line that connects the assembled battery and an external terminal of the housing.

6. A detection method for detecting an abnormality of a communication line connecting an energy storage apparatus and a moving body controller that are mounted on a moving body, wherein the method comprises the step of:

detecting occurrence or non-occurrence of the abnormality of the communication line based on at least two pieces of information from:

a moving body state signal transmitted from the moving body controller to the energy storage apparatus and stored by the energy storage apparatus, a communication state between the moving body controller and the energy storage apparatus, and information on charge and discharge of the energy storage apparatus; and in response to detecting occurrence of the abnormality of the communication line, prohibiting control for interrupting a current of the energy storage apparatus.

* * * * *

UNITED STATES PATENT AND TRADEMARK OFFICE
CERTIFICATE OF CORRECTION

| | | |
|---|---|---|
| PATENT NO. | : 11,913,993 B2 | Page 1 of 1 |
| APPLICATION NO. | : 17/277580 | |
| DATED | : February 27, 2024 | |
| INVENTOR(S) | : Shiraishi | |

It is certified that error appears in the above-identified patent and that said Letters Patent is hereby corrected as shown below:

In the Claims

Column 12,
Line 50, Claim 1, "the body" should read --the moving body--.

Signed and Sealed this
Thirty-first Day of December, 2024

Derrick Brent
*Acting Director of the United States Patent and Trademark Office*